United States Patent
Hao et al.

(10) Patent No.: US 9,634,318 B2
(45) Date of Patent: Apr. 25, 2017

(54) OXIDE SHELL FORMATION ON INORGANIC SUBSTRATES VIA LITHIUM POLYOXOANION SALT DEPOSITION

(71) Applicant: SACHEM, INC., Austin, TX (US)

(72) Inventors: Jianjun Hao, Austin, TX (US); Craig S. Allen, Austin, TX (US)

(73) Assignee: Sachem, Inc., Austin, TX (US)

( * ) Notice: Subject to any disclaimer, the term of this patent is extended or adjusted under 35 U.S.C. 154(b) by 0 days.

(21) Appl. No.: 14/766,156

(22) PCT Filed: Mar. 12, 2013

(86) PCT No.: PCT/US2013/030376
§ 371 (c)(1),
(2) Date: Aug. 6, 2015

(87) PCT Pub. No.: WO2014/142803
PCT Pub. Date: Sep. 18, 2014

(65) Prior Publication Data
US 2015/0380727 A1    Dec. 31, 2015

(51) Int. Cl.
*H01M 4/04*    (2006.01)
*H01M 4/139*    (2010.01)
(Continued)

(52) U.S. Cl.
CPC ...... *H01M 4/139* (2013.01); *H01L 21/02175* (2013.01); *H01L 21/02178* (2013.01);
(Continued)

(58) Field of Classification Search
USPC .......................... 427/58, 126.3, 126.4, 126.6
See application file for complete search history.

(56) References Cited

U.S. PATENT DOCUMENTS

| 6,602,918 B1 | 8/2003 | Ichinose |
| 2003/0082448 A1 | 5/2003 | Cho et al. |

(Continued)

FOREIGN PATENT DOCUMENTS

| JP | 2002151077 | 5/2002 |
| WO | 2012032518 | 3/2012 |
| WO | WO 2012/032518 | * 3/2012 |

OTHER PUBLICATIONS

PCT/US2013/030376; PCT International Search Report and Written Opinion of the International Searching Authority dated Oct. 29, 2013.
(Continued)

*Primary Examiner* — Brian K Talbot
(74) *Attorney, Agent, or Firm* — Renner, Otto, Boisselle & Sklar, LLP

(57) ABSTRACT

The present invention provides a process for depositing an oxide coating on an inorganic substrate, including providing an aqueous composition containing a tetraalkylammonium polyoxoanion and lithium hydroxide; contacting the aqueous composition with an inorganic substrate for a time sufficient to deposit a lithium polyoxoanion on surfaces of the inorganic substrate to form an initially coated inorganic substrate; and heating the initially coated inorganic substrate for a time sufficient to convert the lithium polyoxoanion to an oxide to form on the inorganic substrate an oxide coating derived from the polyoxoanion. The inorganic substrate may be a ceramic material or a semiconductor material, a glass or other dielectric material, and the ceramic material may be a lithium ion battery cathode material.

16 Claims, 15 Drawing Sheets

(51) Int. Cl.
- *H01M 4/36* (2006.01)
- *H01M 4/505* (2010.01)
- *H01M 4/525* (2010.01)
- *H01M 4/62* (2006.01)
- *H01L 21/02* (2006.01)
- *H01M 4/1391* (2010.01)
- *H01M 4/66* (2006.01)
- *H01M 10/0525* (2010.01)
- *H01M 4/485* (2010.01)
- *H01M 4/58* (2010.01)

(52) U.S. Cl.
 CPC .... *H01L 21/02318* (2013.01); *H01M 4/0471* (2013.01); *H01M 4/1391* (2013.01); *H01M 4/366* (2013.01); *H01M 4/505* (2013.01); *H01M 4/525* (2013.01); *H01M 4/62* (2013.01); *H01M 4/664* (2013.01); *H01M 10/0525* (2013.01); *H01M 4/485* (2013.01); *H01M 4/5825* (2013.01)

(56) References Cited

U.S. PATENT DOCUMENTS

| | | | |
|---|---|---|---|
| 2006/0068289 A1* | 3/2006 | Paulsen | C01G 51/42 429/231.1 |
| 2009/0023581 A1 | 1/2009 | Di Monte et al. | |
| 2011/0042609 A1 | 2/2011 | Park et al. | |
| 2011/0076556 A1 | 3/2011 | Karthikeyan et al. | |
| 2016/0028079 A1 | 1/2016 | Allen et al. | |

OTHER PUBLICATIONS

PCT/US2013/030376: International Preliminary Report on Patentability mailed May 22, 2015.

Sergey Sladkevich et al.; "Antimony Tin Oxide (ATO) Nanoparticle Formation from H2O2 Solutions: a New Generic Film Coating from Basic Solutions", Inorganic Chemistry, vol. 49, No. 20, Oct. 18, 2010, pp. 9110-9112.

Son J T: "Novel electrode material for Li ion battery based on polycrystalline LiNb03", Electrochemistry Communications, vol. 6, No. 10, Aug. 18, 2004, pp. 990-994.

PCT/US2013/030371; PCT International Search Report and Written Opinion of the International Searching Authority dated Oct. 28, 2013.

PCT/US2013/030371; International Preliminary Report on Patentability mailed May 7, 2015.

Co-pending, commonly owned U.S. Appl. No. 14/765,994, filed Aug. 5, 2015, published as US 2016/0028079 (see above).

* cited by examiner

Estimated oxide shell thickness 1 nm

Estimated oxide shell thickness 10 nm

Estimated oxide shell thickness 20 nm

Estimated oxide shell thickness 30 nm

OXIDE SHELL FORMATION ON INORGANIC SUBSTRATES VIA LITHIUM POLYOXOANION SALT DEPOSITION

The present application is a U.S. National Stage Application based on and claiming benefit and priority under 35 U.S.C. §371 of International Application No. PCT/US2013/030376, filed 12 Mar. 2013, the entirety of which is hereby incorporated by reference into the present application.

TECHNICAL FIELD

The present invention relates to processes and compositions useful for forming metal oxide coatings on inorganic substrates. More particularly, the present invention relates to formation of metal oxide coatings, such as alumina, on inorganic substrates, such as ceramic powders, by use of quaternary ammonium metalates, such as aluminate, and lithium hydroxide. Most particularly, the present invention relates to formation of a metal oxide coating, such as alumina, on lithium ion battery cathode materials.

BACKGROUND

Lithium ion battery cathode ceramic materials have been an intriguing research field for many years. Out of various cathode materials, lithium transition metal oxides represent the most successful category of cathode materials. The crystal structures of lithium transition metal oxides can be a layered structure with a chemical formula of $LiMO_2$ (where M is, for example, Mn, Co, and/or Ni) or a three dimensional spinel structure with a typical chemical formula of $LiM_2O_4$ (M is, for example, Mn). Both layered structure and spinel structures include a framework of the transition metal and oxygen, into which the lithium ions are intercalated.

Lithium ion battery cathode ceramic materials, for example, lithium cobalt oxide, lithium nickel oxide or lithium cobalt nickel oxide, have excellent basic performance for energy storage. However, these materials also have drawbacks, such as insufficient safety, in terms of thermal stability and overcharge performance. To solve these problems, various safety methods have been introduced, which include shut-down functions of separators, additives to the electrolyte, safety protection circuits and PTC (Positive Temperature Coefficient) devices. Unfortunately, all these methods were designed to be used under conditions in which the charging capability of the cathode active material is not too high. Thus, when the charge capability of the cathode active material is increased to meet the increasing demand for high capacity in such batteries, it can cause deterioration in the safety of these systems.

On the other hand, the operation of an electrochemical battery always generates an interface layer between the active cathode material and the electrolyte, called a solid electrolyte interface (SEI). High voltage operation can easily destroy this interface layer, leading to poor cycling performance and capacity loss. Thus, controlling and stabilizing SEI formation and structure is still of great importance and practical interest.

Furthermore, some active manganese-containing cathode materials, like lithium manganese oxide, when directly in contact with the electrolyte, have a problem of manganese dissolution into the cell electrolyte solution during cell operation. This may cause capacity fading, i.e., loss of capacity through repeated charging and discharging cycles.

To overcome the above drawbacks, a core/shell structure has been suggested to improve the cycle life and safety of lithium batteries. The formation of a passivation shell on active cathode ceramic particle surface (the core) can provide structural and thermal stability in highly delithiated (discharged) states, thus the cycle life and safety may be improved. There are various shells that have been described for cathode ceramic particle surfaces, which include shells formed of, for example, barium titanate ($BaTiO_3$), lithium iron phosphate oxide, and gradient $LiCoO_2$. Most of these shell formation schemes either use expensive raw materials or employ a complicated process, or both. In addition to the active material shells described above, inert metal oxide shells have been investigated over a long time. The inert metal oxide shell formation is a relatively cheaper process. Various inert metal oxide shells, such as $TiO_2$, $Al_2O_3$, MgO and ZnO, have been prepared on ceramic particle surface through so-called heterogeneous nucleation wet chemistry. However, current heterogeneous nucleation to form inert oxide shells is not controllable, particularly in that known processes do not provide any way to control the shell thickness with acceptable precision. The inert metal oxide shells by definition are not electrochemically active—meaning they do not facilitate ion or electron transport. At the same time, such shells should not interfere with the operation. If a too thick and/or too dense inert shell is formed, the resistance of the shell can limit the charging and discharging rate capability of the electrode and cell performance would deteriorate. Current processes for deposition of aluminum oxide (and other inert oxide) by heterogeneous nucleation using aluminum nitrate (or other aluminum salts), involves ion-exchange between Li cations in the active ceramic material and Al ions in the process solution. This may cause Li ion loss from the active ceramic material, waste generation and possible generation of cathode structure defects when the shell is deposited.

Thus, the problem of how to provide an oxide coating on an inorganic substrate, such as the active ceramic material in a lithium ion battery cathode, has been long-standing and not satisfactorily solved to date.

SUMMARY

To address the foregoing problems, the present invention provides a method to create an oxide shell, including either metal oxides or certain nonmetal oxides, on ceramic or other inorganic substrates, in which the oxide shell has a precisely controllable thickness. The thickness is precisely controllable by controlling the content of quaternary ammonium cations and polyoxoanions in the reaction composition and the speed of deposition. The substrates may include active cathode ceramic particle surfaces, such as ceramic materials used in lithium ion battery cathodes. The method employs an organic salt composed of quaternary ammonium cations and polyoxoanions as shell formation material sources. By adding lithium hydroxide, the organic salt can slowly form one of a conducting shell layer, a semiconducting shell layer or an insulating shell layer on such a ceramic surface. Thus, the speed of deposition can be affected by the content of lithium hydroxide in the reaction composition.

Thus, in one embodiment, the present invention relates to a process for depositing an oxide coating on an inorganic substrate, comprising:

providing an aqueous composition containing a tetraalkylammonium polyoxoanion and lithium hydroxide;

contacting the aqueous composition with an inorganic substrate for a time sufficient to deposit a lithium polyoxoanion derived from the polyoxoanion on surfaces of the inorganic substrate to form an initially coated inorganic substrate; and heating the initially coated inorganic substrate for a time sufficient to convert the lithium polyoxoanion to an oxide to form on the inorganic substrate an oxide coating derived from the polyoxoanion.

In one embodiment, the tetraalkylammonium polyoxoanion comprises tetramethylammonium hydroxide.

In one embodiment, the tetraalkylammonium polyoxoanion comprises a polyoxoanion having the general formula $A_xO_y^{z-}$, wherein A represents one or more transition metal or other metal or metalloid capable of forming a polyoxoanion. In one embodiment, the atom A in this general formula is selected from Al, Si, B, Ga, Ge, As, In, Sn, Sb, Tl, Pb and Bi, or a combination of any two or more thereof, O is an oxygen atom, and values of x, y and z depend on the valence of A in the polyoxoanion and y>x.

In one embodiment, the transition metal comprises one or more of Ti, V, Zn, Ni, Co, Mn, Fe and Cu.

In one embodiment, the inorganic substrate comprises a ceramic oxide. In one embodiment, the ceramic oxide comprises $Li^+$ ions and is adapted for use in a lithium ion battery ceramic cathode material.

In one embodiment, the inorganic substrate comprises a semiconductor material. In one embodiment, the semiconductor material comprises a semiconductor wafer, in which optionally the semiconductor wafer comprises electronic circuitry.

In one embodiment, the tetraalkylammonium polyoxoanion is tetramethylammonium aluminate and the inorganic substrate is a ceramic material. In one embodiment, the ceramic material is a lithium ion battery cathode material.

In another, more specific embodiment, the present invention relates to a process for depositing an alumina coating on an inorganic substrate, comprising:

providing an aqueous composition containing a tetraalkylammonium aluminate and lithium hydroxide;

contacting the aqueous composition with an inorganic substrate for a time sufficient to deposit lithium aluminate on surfaces of the inorganic substrate to form an initially coated inorganic substrate; and heating the initially coated inorganic substrate for a time sufficient to convert the lithium aluminate to alumina.

In one embodiment, the inorganic substrate is a ceramic material. In one embodiment, the ceramic material is a lithium ion battery cathode material.

In one embodiment, the tetraalkylammonium aluminate is tetramethylammonium aluminate.

In one embodiment, the heating is carried out at a temperature in the range from about 450° C. to about 1000° C., or at a temperature of about 500° C.

The presence of the $Li^+$ ions from the lithium hydroxide in the aqueous composition results in inclusion of the $Li^+$ ions in the oxide shell.

The invention described herein is not only applicable for core-shell structure formation for ceramic particles, but also is applicable for passivation shell formation on inorganic material surfaces in plane plate form or almost any other irregular shape form. Thus, for example, the present invention may be applied in formation of an oxide layer on a semiconductor, e.g., a silicon or silicon/germanium, wafer surface or on other inorganic surfaces, e.g., on a glass surface, as well as on semiconductor devices with electronic components already present.

The advantages of this invention include one or more of (1) the present process is a room temperature process; (2) the present process is a simple one-step process; (3) the present process provides a shell thickness that is predictable and controllable; (4) the present process is a homogeneous shell; (5) the present process is applicable for thin film shell formation on the substrates; (6) the present process is not an ion-exchange process that might deplete ions from the substrate; (7) the present process provides for shell formation on each single crystal particle of the substrate; (8) the present process provides for wide applications on many substrates in addition to Li ion battery cathode ceramic materials.

Figure 1:
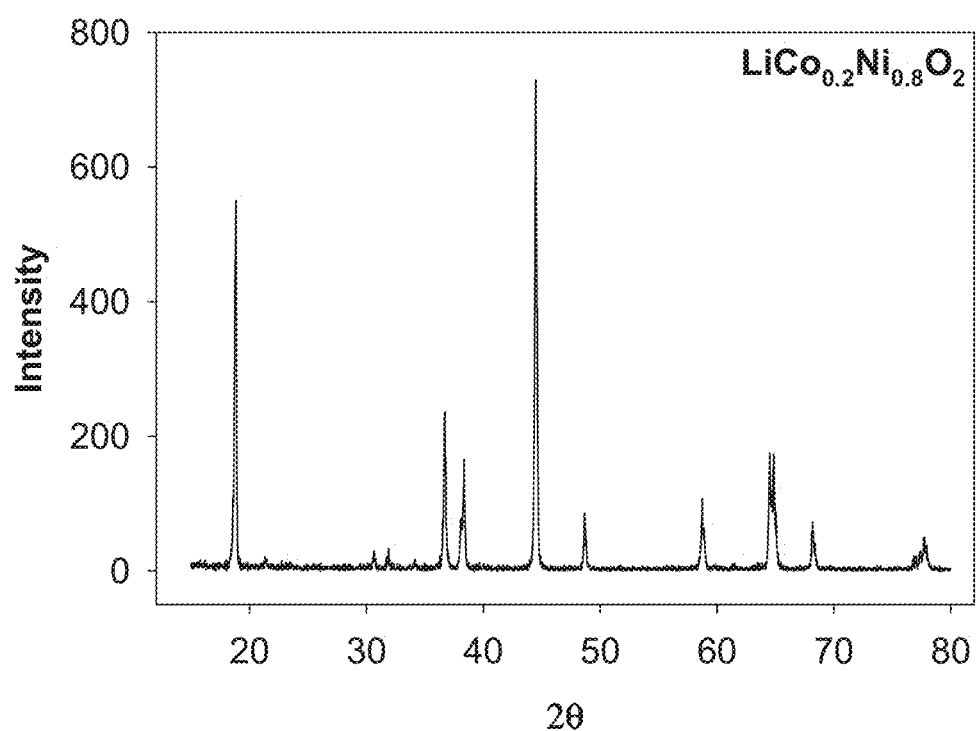
FIGS. 1-5 are X-ray diffraction (XRD) patterns for exemplary inorganic substrates, with and without the oxide coating, in accordance with certain embodiments of the present invention.

The Figures are provided as non-limiting examples of embodiments of the present invention and comparative examples, and are intended to facilitate understanding of the present invention.

DETAILED DESCRIPTION

As used herein, the term polyoxoanion refers to a chemical compound having the general formula $A_xO_y^{z-}$ (where A represents a transition metal ion, as known from the Periodic Table, e.g., Ti, V, Zn, Ag, Ni, Co, Mn, Fe, Cu, Au, or a metal or metalloid including Al, Si, B, Ga, Ge, As, In, Sn, Sb, Tl, Pb and Bi, or a combination of any two or more thereof, and O is an oxygen atom). The values of x, y and z depend on the valence of the atom A in the polyoxoanion in the polyoxoanion and y>x. In most embodiments, the atom A is in its highest oxidation (+) state. The atom A should include an atom capable of forming a polyoxoanion.

As described in the foregoing, the present invention relates to formation of an oxide shell, e.g., a passivation shell, on surfaces of inorganic material substrates. The invention is particularly applicable to Li ion battery cathode ceramic particles. The process uses organic salts composed of quaternary ammonium cations and polyoxoanions, in combination with lithium hydroxide.

In the following, a TMA (tetramethylammonium) aluminate salt is used as an example to show a possible mechanism for shell formation on an inorganic material surface.

Although not to be bound by theory, it is believed that the process of the present invention proceeds as follows. TMA aluminate and lithium hydroxide can slowly react to form lithium aluminate on the surface of the inorganic substrate through heterogeneous nucleation. The layer of lithium aluminate can grow as more and more reactants are consumed, until the aluminate ions in the solution are completely consumed. Thus, a lithium aluminate precursor of the nascent alumina shell is formed on the inorganic material surface. Then, the inorganic material, with the precursor lithium aluminate shell formed on its surface, is removed from the wet chemical solution and is heated in an oven at an elevated temperature in the range from about 450° C. to about 1000° C., or, e.g., about 500° C., for several hours, e.g., for 4-10 hours, or about 5 hours. Upon the heating, the lithium cations in the lithium aluminate precursor shell may migrate into the inorganic substrate due to an intercalation reaction with the substrate, leaving the aluminate to form the aluminum oxide shell. The degree to which the Li ions migrate into the core depends on the Li content of the core. If the core is already saturated with Li ions, then little or no migration may occur. If not all Li ions can migrate into the core then some Li ions will remain in the shell. This provides the benefit of obtaining the desired alumina shell on the inorganic substrate core, while at the same time adding lithium ions to the core. This is especially desirable for production of Li ion battery cathode ceramic particles.

The invention described herein is applicable for core-shell structure formation on inorganic material particles or for passivation shell formation on inorganic material surfaces in plane plate form or any other regular or irregular shape form. That is, the present invention can form the disclosed oxide shell on surfaces ranging from fine ceramic particles, such as are used in the formation of Li ion battery cathodes, to large, flat surfaces such as those on semiconductor wafers and devices, and on any kind of irregular surface.

The inorganic material particle or substrate can be: oxide, ceramic, glass, silicon and any other inorganic material that is capable of forming bonds to a metal oxide through atoms such as oxygen atoms.

The shell material or passivation material can be a polyoxoanion of any of the transition metal, e.g., Ti, V, Zn, Ag, Ni, Co, Mn, Fe, Cu, Au, as well as metals and metalloids including Al, Si, B, Ga, Ge, As, In, Sn, Sb, Tl, Pb and Bi. Thus, the polyoxoanions useful in the present invention include all possible metal elements and nonmetal elements that have or can form polyoxoanions, but does not include N, O, P, S, F, Cl, Br, I, etc., or the alkali or alkaline earth metals.

The present invention thus provides a process for controllably depositing an oxide coating on an inorganic substrate, in which the thickness of the oxide coating can be readily and predictably controlled.

The aqueous composition contains a tetraalkylammonium polyoxoanion and lithium hydroxide. The aqueous composition contains the tetraalkylammonium polyoxoanion at a concentration in the range from about 0.0001 wt % to about 30 wt %, and in one embodiment in the range from about 0.011 wt % to about 1.1 wt %, based on the total weight of the aqueous composition. The content of the tetraalkylammonium polyoxoanion should be selected based on the quantity of inorganic substrate to the treated and the thickness of the deposit of the oxide shell desired to be obtained. As shown in the Examples, by adjusting the stoichiometry of the aqueous composition, different but controllable thicknesses of the oxide shell can be obtained.

The lithium hydroxide is provided at a concentration in the range from about 0.0001 wt % to about 30 wt %, and in one embodiment in the range from about 0.009 wt % to about 0.023 wt %. The content of lithium ions in the oxide shell should be from 0 to about 50 wt %, and for an aluminum oxide shell, the Li ion content may be about 22 wt %. The content of the added lithium hydroxide in the aqueous composition may be adjusted as needed to obtain the desired content of lithium ions in the oxide shell.

Since the aqueous composition includes lithium ions, $Li^+$, the oxide coating can be provided with a controllable content of lithium ions, which facilitates use of the products for lithium ion battery cathode materials.

In one embodiment, the weight ratio of the tetraalkylammonium polyoxoanion to the inorganic substrate ranges from about 0.0001 to about 2, and in one embodiment, from about 0.002 to about 0.5. As will be recognized, this ratio is dependent on the surface area of the inorganic substrate and the desired thickness of the oxide shell to be deposited. As shown in the Examples below, the ratio range from 0.01 to about 0.33 is calculated to deposit from about 1 nm to about 30 nm of the oxide shell on finely ground ceramic particles intended for use in lithium ion battery cathode materials. The foregoing ranges are merely exemplary, and the desired ratios can be calculated by the skilled person based on the desired thickness of the oxide shell and the nature of the inorganic substrate with relatively simple and straightforward calculations and some small but reasonable amount of experimentation. The Examples set forth below provide a good starting point for such calculations.

The step of contacting the aqueous composition with an inorganic substrate is carried out for a time sufficient to deposit the lithium polyoxoanion on surfaces of the inorganic substrate to form an initially coated inorganic substrate. The time for this deposition is generally in the range of about 4 hours to about 24 hours, and in one embodiment is from about 6 hours to about 12 hours, and in one embodiment from about 8 to about 10 hours.

The step of contacting is carried out by constant mixing of the ingredients in the mixture of the aqueous composition and the particles of the inorganic substrate. The actual method of mixing of course depends on the volume of material being treated. On a small scale, a simple laboratory shaker can be used, whereas on a larger, e.g., preparative or industrial scale, appropriately heavier mechanical mixing devices may be employed, and these can be appropriately selected by persons of ordinary skill in the art.

The step of heating the initially coated inorganic substrate is carried out for a time sufficient to convert the lithium polyoxoanion to form the oxide. The oxide coating is derived from the polyoxoanion and the time needed to convert the lithium polyoxoanion to the oxide depends to some extent on the identity of the polyoxoanion and the central atom, i.e., of the element A in the general formula $A_xO_y^{z-}$, as described below.

The tetraalkylammonium polyoxoanion can include alky groups of any desired size, but in most embodiments, the alkyl groups are each a $C_1$-$C_{18}$ alkyl group, or a $C_1$-$C_8$ alkyl group, or a $C_1$-$C_4$ alkyl group, any of which may be branched or unbranched. In general, the sizes of the alkyl groups are not considered to be critical, but the alkyl groups should not be so long as to impede solubility of the resulting tetraalkylammonium polyoxoanion in the aqueous composition. In one embodiment, the tetraalkylammonium polyoxoanion comprises tetramethylammonium hydroxide (TMAH). TMAH is normally the preferred quaternary ammonium compound, since it is readily available and is very soluble in aqueous compositions.

As described above, the polyoxoanion of the tetraalkylammonium polyoxoanion has the general formula $A_xO_y^{z-}$, wherein A represents a transition metal ion or a metal or metalloid capable of forming a polyoxoanion. In one embodiment, the atom A in this general formula is selected from Al, Si, B, Ga, Ge, As, In, Sn, Sb, Tl, Pb and Bi, or a combination of any two or more thereof, O is an oxygen atom, and values of x, y and z depend on the valence of A in the polyoxoanion and y>x. Thus, if A is Al, x=1, y=3 and z=1; if A is B, x=1, y=3 and z=3; if A is Mn, x=1, y=4 and z=1, and so on, as will be readily appreciated by the person of skill in the art.

In one embodiment, the transition metal comprises one or more of Ti, V, Zn, Ni, Co, Mn, Fe and Cu.

In one embodiment, the inorganic substrate comprises a ceramic oxide. In one embodiment, the ceramic oxide comprises $Li^+$ ions and is adapted for use in a lithium ion battery ceramic cathode material. The ceramic oxide may be, for example, one of the following:

lithium nickel manganese cobalt oxide, $LiNi_{0.33}Mn_{0.33}Co_{0.33}O_2$ lithium nickel cobalt aluminum oxide, $LiNi_{0.8}Co_{0.15}Al_{0.05}O_2$ lithium nickel cobalt aluminum oxide, $LiNi_{0.79}Co_{0.20}Al_{0.01}O_2$ lithium nickel cobalt oxide, $LiNi_{0.8}Co_{0.2}O_2$ lithium iron phosphate, $LiFePO_4$ lithium nickel oxide, $LiNiO_2$ lithium trivanadate, $LiV_3O_8$ manganese nickel carbonate; $Mn_{0.75}Ni_{0.25}CO_3$ copper vanadium oxide, $CuV_2O_6$ lithium cobalt phosphate, $LiCoPO_4$ lithium manganese dioxide, $LiMnO_2$ lithium manganese oxide, $LiMn_2O_4$ lithium manganese nickel oxide, $Li_2Mn_3NiO_8$ lithium iron oxide, $LiFeO_2$ lithium cobalt oxide, $LiCoO_2$ lithium molybdate, $LiMoO_4$ lithium titanate, $Li_2TiO_3$ lithium cobalt manganese oxide, $LiCo_{0.8}Mn_{0.2}O_2$ lithium nickel manganese oxide, $LiNi_{0.85}Mn_{0.15}O_2$ lithium cobalt nickel manganese oxide, $LiCo_{0.45}Ni_{0.45}Mn_{0.10}O_2$ lithium nickel manganese oxide, $LiNi_{0.8}Mn_{0.2}O_2$ lithium nickel cobalt boron oxide, $LiNi_{0.79}Co_{0.2}B_{0.01}O_2$ lithium nickel cobalt tin oxide, $LiNi_{0.79}Co_{0.2}Sn_{0.01}O_2$ lithium nickel cobalt aluminum oxide, $LiNi_{0.72}Co_{0.2}B_{0.08}O_2$.

In addition to ceramics, including the foregoing exemplary materials suitable for use as lithium ion battery cathodes (the list is not all-inclusive of such materials), the inorganic substrate can be almost any inorganic material, including the ceramic materials and other inorganic materials such as silicon, glass, metals, dielectrics, and conductive materials. In one embodiment, the inorganic substrate comprises a semiconductor material. In one embodiment, the semiconductor material comprises a semiconductor wafer, in which optionally the semiconductor wafer comprises electronic circuitry.

In one embodiment, the tetraalkylammonium polyoxoanion is tetramethylammonium aluminate and the inorganic substrate is a ceramic material. In one embodiment, the ceramic material is a lithium ion battery cathode material. In a presently preferred embodiment, the present invention relates to a process for depositing an alumina coating on an lithium ion battery cathode material as the inorganic substrate, including the steps described above, in which the aqueous composition contains tetramethylammonium aluminate and lithium hydroxide.

It is noted that, although the present invention provides a thin layer of the oxide derived from the polyoxoanion on the surface of the target substrate, since the layer deposited is so thin, the X-ray diffraction (XRD) pattern of the resulting material should not change substantially. If too heavy a layer of the oxide derived from the polyoxoanion is deposited on the surface of the target substrate, the XRD pattern may change, and this would reveal that the layer deposited is thicker than needed or desired. Thickness, and especially excess thickness, can be observed and estimated via SEM, by comparing SEM micrographs of the inorganic substrate taken before and after deposition of the oxide shell. See, e.g., FIGS. 6-10 and the descriptions thereof in the Examples below. For materials to be used as Li ion battery cathode materials, the layer of oxide derived from the polyoxoanion on the surface of the ceramic material should be thin enough to allow passage of $Li^+$ ions during operation of the battery. If the layer is so thick that it inhibits free flow of the $Li^+$ ions, then it is too thick. In one embodiment, the thickness of the oxide derived from the polyoxoanion on the surface of the target substrate is in the range from about 1 nm to about 20 nm, and in another embodiment, is in the range from about 2 nm to about 10 nm. Here, and elsewhere in the specification and claims of the present application, the limits of the ranges may be combined, and the ranges are all deemed to include intervening integral and fractional values. Thus, for example, although a thickness of 4 nm is not specifically mentioned, since this value falls within the disclosed range, it is included in the disclosure. Similarly, although a thickness of 3.5 nm is not specifically mentioned, it too is included in the disclosure.

EXAMPLES

The quaternary ammonium polyoxoanion materials used herein can be prepared using a two-step process including precipitation and dissolution. The following examples use aluminum oxides as the polyoxoanion, but as noted above, this process is broadly applicable to many metal and metalloid atoms. Preferably, the quaternary ammonium polyoxoanion used is tetramethylammonium aluminate.

Preparation of a Quaternary Ammonium Aluminate

To a 200 ml flask with a magnetic stir bar, is added 37.51 g (0.1 mole) of aluminum nitrate nonahydrate and 200 g DI-water. The solution is stirred until it forms a clear solution. To this solution, is slowly added 114.04 g (0.3 mol) of 23.98% wt tetramethylammonium hydroxide (TMAH) solution. A white precipitate occurs immediately. The resulted white precipitate is filtered and rinsed with 200 ml DI-water three times. The resulting white solid is freeze-dried to afford dry aluminum hydroxide.

Then, to a 200 ml flask with a magnetic stir bar, is added 5.69 g (0.073 mol) of the above aluminum hydroxide powder and 145.83 g DI-water. To this suspended solution, is added slowly 83.15 g (0.22 mol) of 23.98% wt TMAH solution. The white aluminum hydroxide powder disappears when all of the TMAH has been added, thus forming tetramethylammonium aluminate at a concentration of 0.311 mmol/g, i.e., 9.24 wt %. It is noted that a stoichiometric amount of TMAH should be used in both steps of the preparation since excess TMAH inhibits deposition of the oxide shell on the ceramic powder core, as discussed in more detail below.

The same two-step procedure, with appropriate adjustments to account for molecular weight, can be carried out to produce the corresponding quaternary ammonium polyoxoanions disclosed herein.

Figure 6:
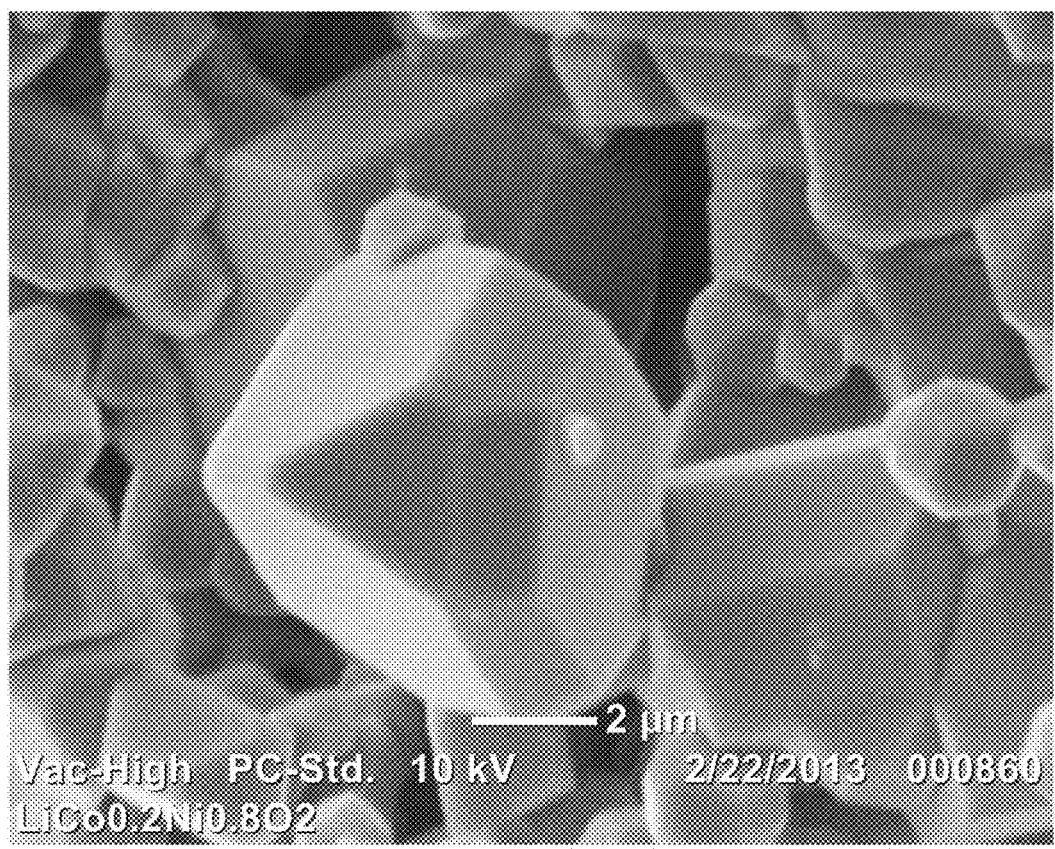
FIGS. 6-15 are scanning electron microscope (SEM) photomicrographs of exemplary inorganic substrates, with and without the oxide coating in accordance with certain embodiments of the present invention.
Figure 7:
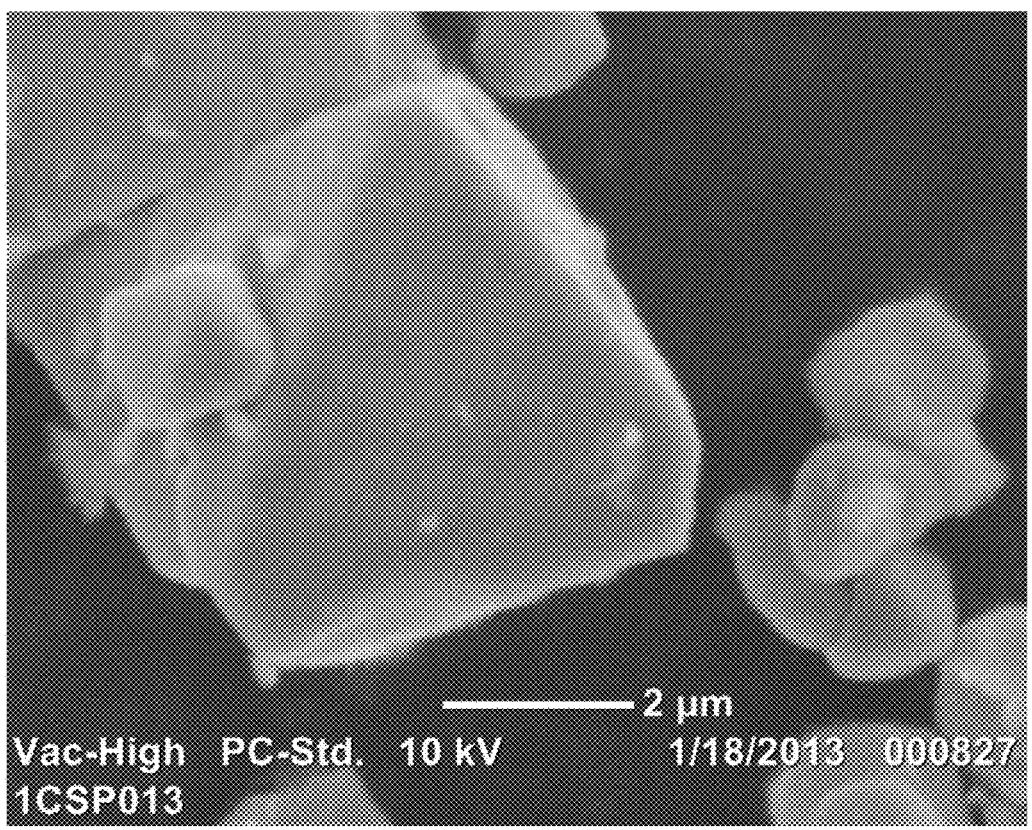

The ceramic powders to which the present invention is applicable include, but are not limited to, Li ion battery cathode ceramic materials, exemplified in the following by lithium nickel cobalt oxide, having a formula $LiCo_{0.2}Ni_{0.8}O_2$. The ceramic powders useful in this invention are either commercial product or may be prepared according to procedures found in the literature and/or known to those having ordinary skill in the art. The XRD pattern of the ceramic powder $LiCo_{0.2}Ni_{0.8}O_2$ is shown in FIG. 1, and its SEM micrograph is shown in FIG. 6.

Example 1

Figure 2:
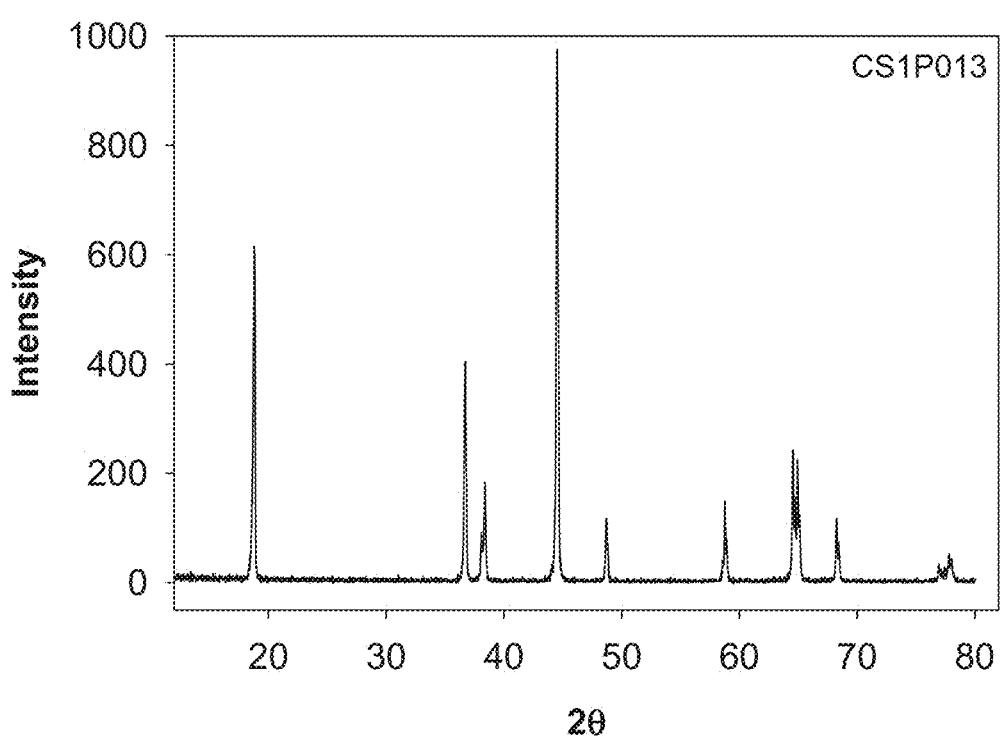

(CS1P013) Preparation of Core-Shell Structure of Lithium Nickel Cobalt Oxide $LiCo_{0.2}Ni_{0.8}O_2$ with an Estimated 1 nm Shell To a 100 ml plastic beaker, is added 0.0594 g of 0.311 mmol/g TMA aluminate, 40 g DI-water and 0.5 g of 1.5 mmol/g lithium hydroxide. The solution total weight is brought up to 50 g by adding additional DI-water. To the thus-prepared solution, is added 0.5 g $LiCo_{0.2}Ni_{0.8}O_2$ with average crystal particle size ~3 um. The mixture is shaken vigorously overnight, and then the ceramic powder is isolated by centrifuge. The collected ceramic powder is placed in an oven and heated at 500° C. for 5 hours, giving the core-shell structure ceramic powder in accordance with the present invention. The XRD pattern is shown in FIG. 2 and the SEM micrograph shown in FIG. 7.

Example 2

Figure 3:
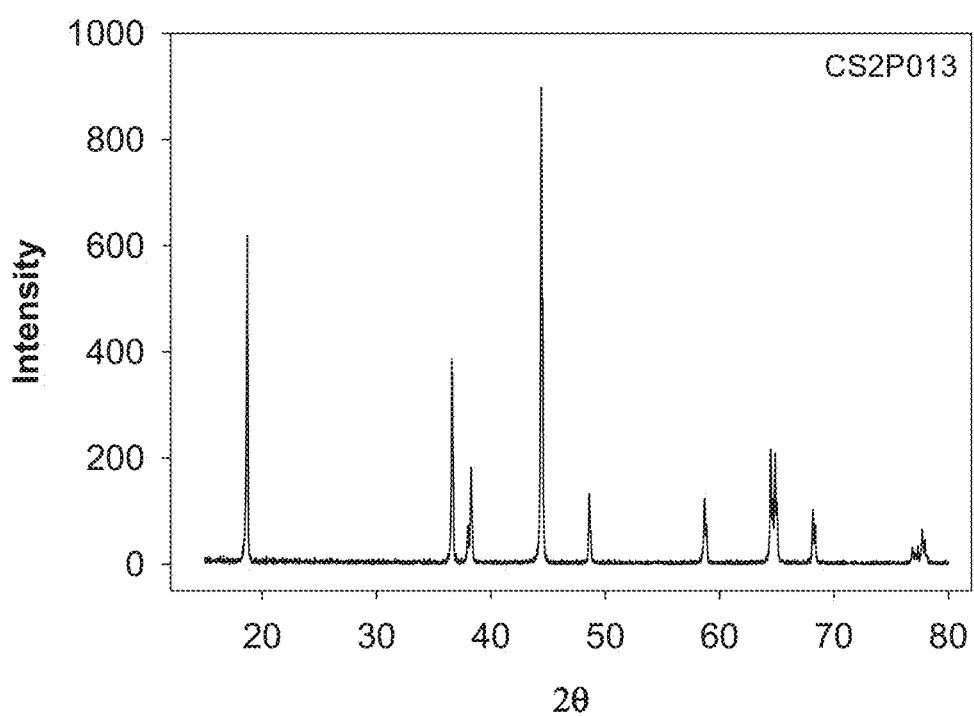
Figure 8:
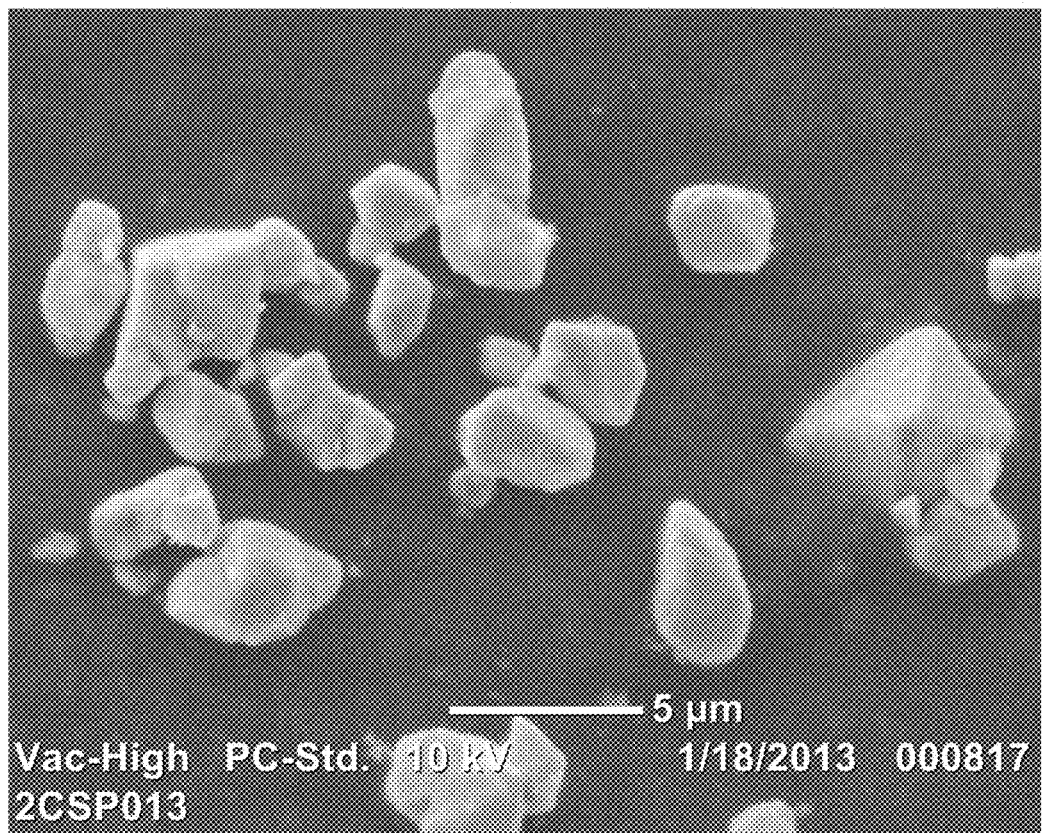

(CS2P013) Preparation of Core-Shell Structure of Lithium Nickel Cobalt Oxide $LiCo_{0.2}Ni_{0.8}O_2$ with an Estimated 10 nm Shell To a 100 ml plastic beaker, is added 0.594 g of 0.311 mmol/g TMA aluminate, 40 g DI-water and 0.74 g of 1.5 mmol/g lithium hydroxide. The solution total weight is brought up to 50 g by adding additional DI-water. To the thus-prepared solution, is added 0.5 g $LiCo_{0.2}Ni_{0.8}O_2$ with average crystal particle size ~3 um. The mixture is shaken vigorously overnight, and then the ceramic powder is isolated by centrifuge. The collected ceramic powder is placed in an oven and heated at 500° C. for 5 hours, giving the core-shell structure ceramic powder in accordance with the present invention. The XRD pattern is shown in FIG. 3 and the SEM micrograph is shown in FIG. 8.

Example 3

Figure 4:
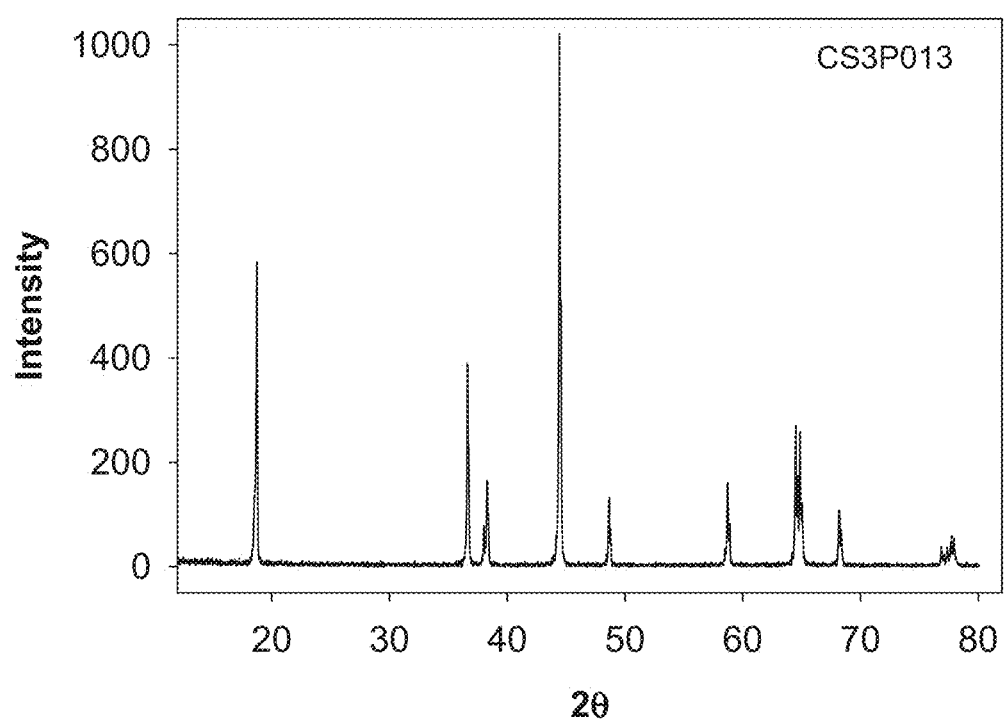
Figure 9:
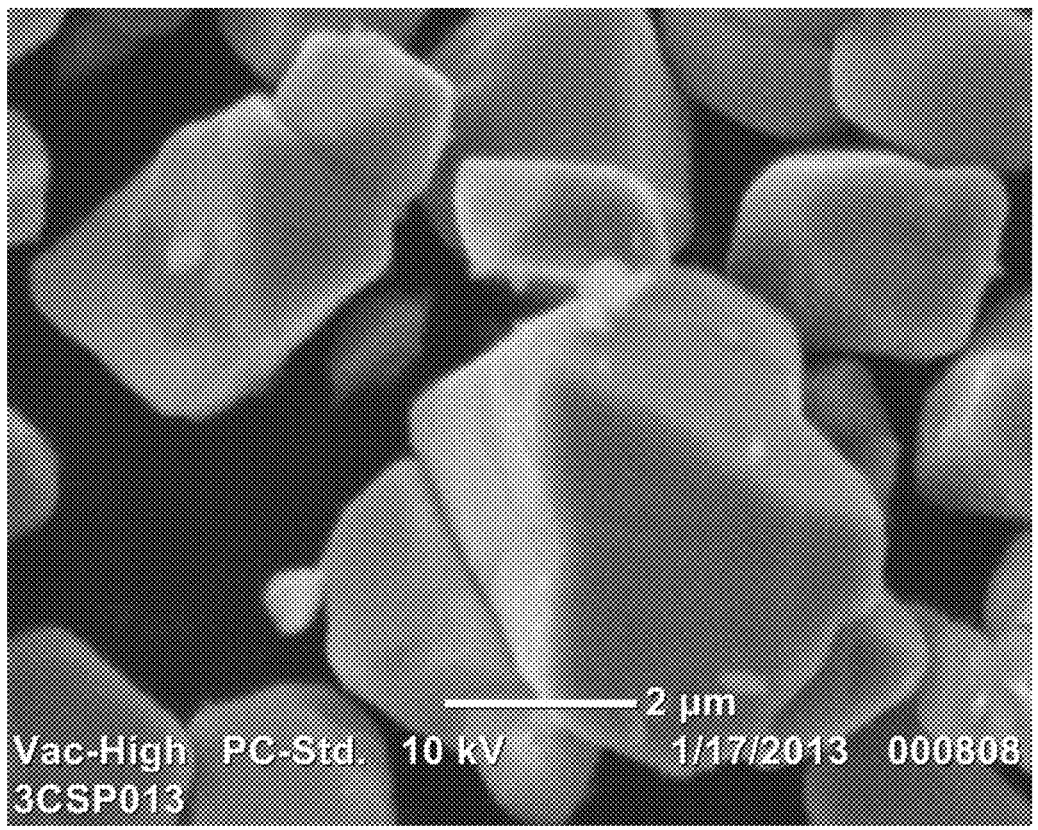

(CS3P013) Preparation of Core-Shell Structure of Lithium Nickel Cobalt Oxide $LiCo_{0.2}Ni_{0.8}O_2$ with Estimated 20 nm Shell To a 100 ml plastic beaker, is added 1.188 g of 0.311 mmol/g TMA aluminate, 40 g DI-water and 1.48 g of 1.5 mmol/g lithium hydroxide. The solution total weight is brought up to 50 g by adding additional DI-water. To the thus-prepared solution, is added 0.5 g $LiCo_{0.2}Ni_{0.8}O_2$ with average crystal particle size ~3 um. The mixture is shaken vigorously overnight, and then the ceramic powder is isolated by centrifuge. The collected ceramic powder is placed in an oven and heated at 500° C. for 5 hours, giving the core-shell structure ceramic powder in accordance with the present invention. The XRD pattern is shown in FIG. 4 and the SEM micrograph is shown in FIG. 9.

Example 4

Figure 5:
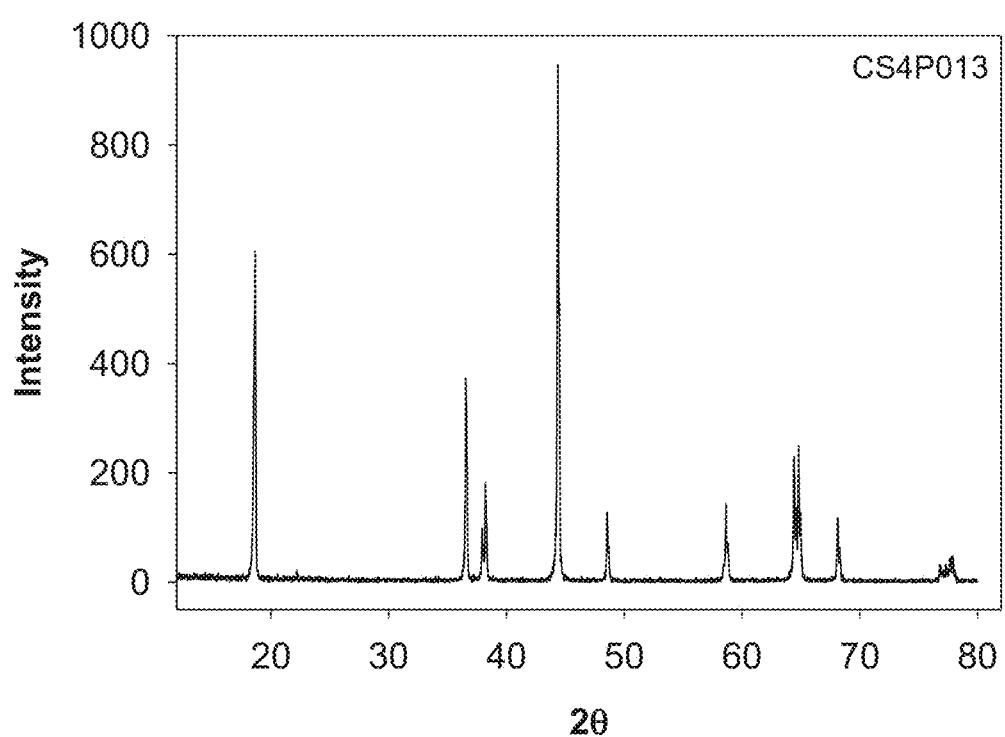
Figure 10:
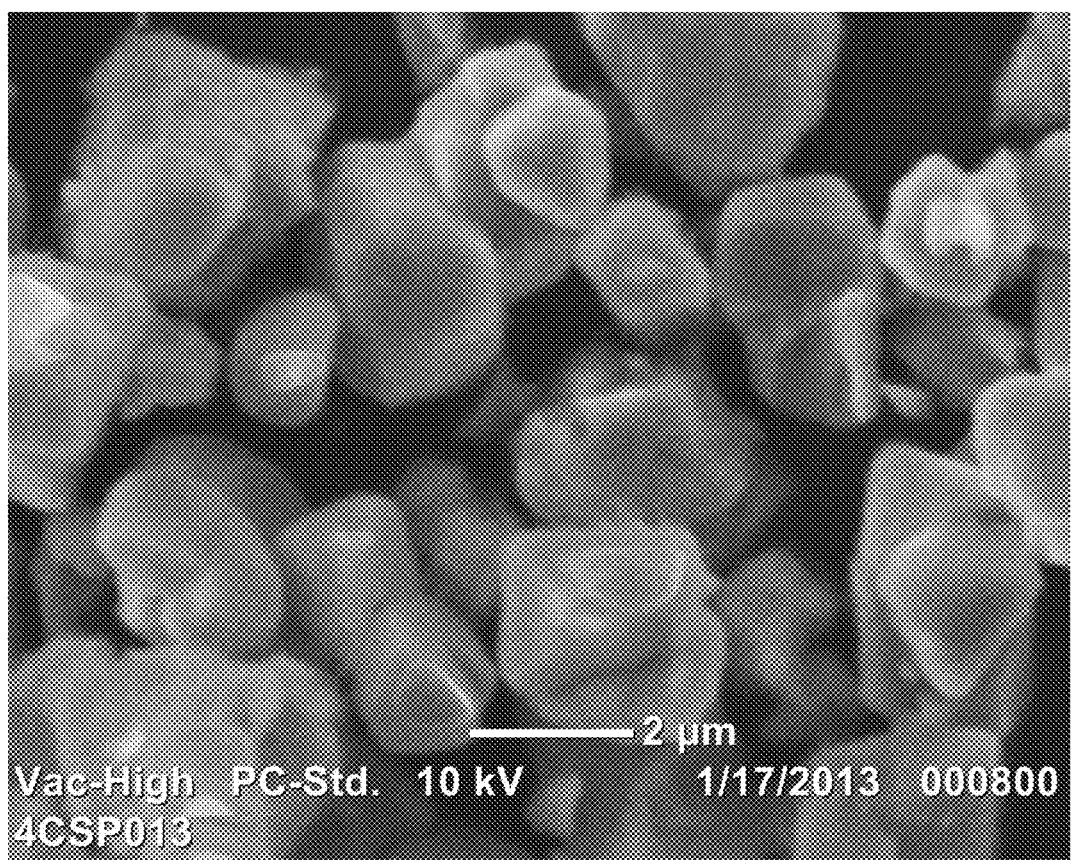

(CS4P013) Preparation of Core-Shell Structure of Lithium Nickel Cobalt Oxide $LiCo_{0.2}Ni_{0.8}O_2$ with an Estimated 30 nm Shell To a 100 ml plastic beaker, is added 1.782 g of 0.311 mmol/g TMA aluminate, 40 g DI-water and 2.21 g of 1.5 mmol lithium hydroxide. The solution total weight is brought up to 50 g by adding additional DI-water. To the thus-prepared solution, is added 0.5 g $LiCo_{0.2}Ni_{0.8}O_2$ with average crystal particle size ~3 um. The mixture is shaken vigorously overnight, and then the ceramic powder is isolated by centrifuge. The collected ceramic powder is placed in an oven and heated at 500° C. for 5 hours, giving the core-shell structure ceramic powder in accordance with the present invention. The XRD pattern is shown in FIG. 5 and the SEM micrograph is shown in FIG. 10.

Discussion of Results of the Foregoing Examples

The XRD pattern and SEM micrograph of $LiCo_{0.2}Ni_{0.8}O_2$ ceramic particles are shown in FIG. 1 and FIG. 6, respectively. Examples 1-4 describe the detailed methods for preparation of the core-shell structures in accordance with the present invention, with $LiCo_{0.2}Ni_{0.8}O_2$ ceramic particles as the core and $Al_2O_3$ as the shell. The core-shell structures are prepared by suspending $LiCo_{0.2}Ni_{0.8}O_2$ ceramic particles in the aqueous solution containing tetramethylammonium aluminate and lithium hydroxide. The ratio of the tetramethylammonium aluminate to the lithium hydroxide is controlled, so that there is not precipitate formed immediately after mixing the two compounds. The $LiCo_{0.2}Ni_{0.8}O_2$ ceramic powder had been carefully ground in a mortar and pestle before loading into the formulation solution for shell preparation, so that there would be no mechanical adhesion between the ceramic particles and the surfaces of all the particles are available to be covered by a shell. After the shell formation process, the ceramic powder that is isolated by centrifuge tends to agglomerate the particles again. However, the agglomerated ceramic particles already have been coated with the shell.

The shell thickness may be controlled by manipulating the TMA aluminate concentration, and the formulations with estimated $Al_2O_3$ shell thickness 1 nm, 10 nm, 20 nm and 30 nm may be designed as in the Examples. The XRD patterns of the as-prepared core-shell structure $LiCo_{0.2}Ni_{0.8}O_2$ ceramic particles with the oxide shell are shown in FIG. 2-FIG. 5. Apparently, the shell formation process does not have an impact on the ceramic crystal structure, and the shell thickness is small enough that it does not significantly affect the XRD pattern.

The SEM micrographs of as-prepared core-shell structure $LiCo_{0.2}Ni_{0.8}O_2$ ceramic particles with the oxide shell are shown in FIG. 7-FIG. 10. As compared with pure $LiCo_{0.2}Ni_{0.8}O_2$ ceramic particles in which the edges of the crystal facets are very sharp, the core-shell structure of the $LiCo_{0.2}Ni_{0.8}O_2$ ceramic particles with the oxide shell made in accordance with the present invention show rounded crystal edges. As the coating thickness increases, the thick shell can be observed based on the obvious difference in appearance compared with the uncoated ceramic particles as shown in FIG. 6.

The process solutions after core-shell formation are analyzed to check the residual aluminum content variation. The result is shown in Table 1. In Table 1, the aluminum conversion refers to the amount of aluminum deposited on the ceramic particle surface relative to the amount of aluminum provided to the reaction in the aqueous composition. Clearly, virtually all of the aluminum in Examples 1-4 solutions has deposited on the ceramic particle surfaces. Thus, the present invention provides an effective way to control shell thickness by controlling the aluminate concentration in the reaction solution.

TABLE 1

Aluminum transfer from solution to ceramic particle surface Examples 1-4

| | Estimated shell thickness | | | |
|---|---|---|---|---|
| | 1 nm Example 1 | 10 nm Example 2 | 20 nm Example 3 | 30 nm Example 4 |
| Aluminum conversion (%) | 99.9 | 99.9 | 99.9 | 99.9 |

Additional Examples

Example 5

Figure 11:
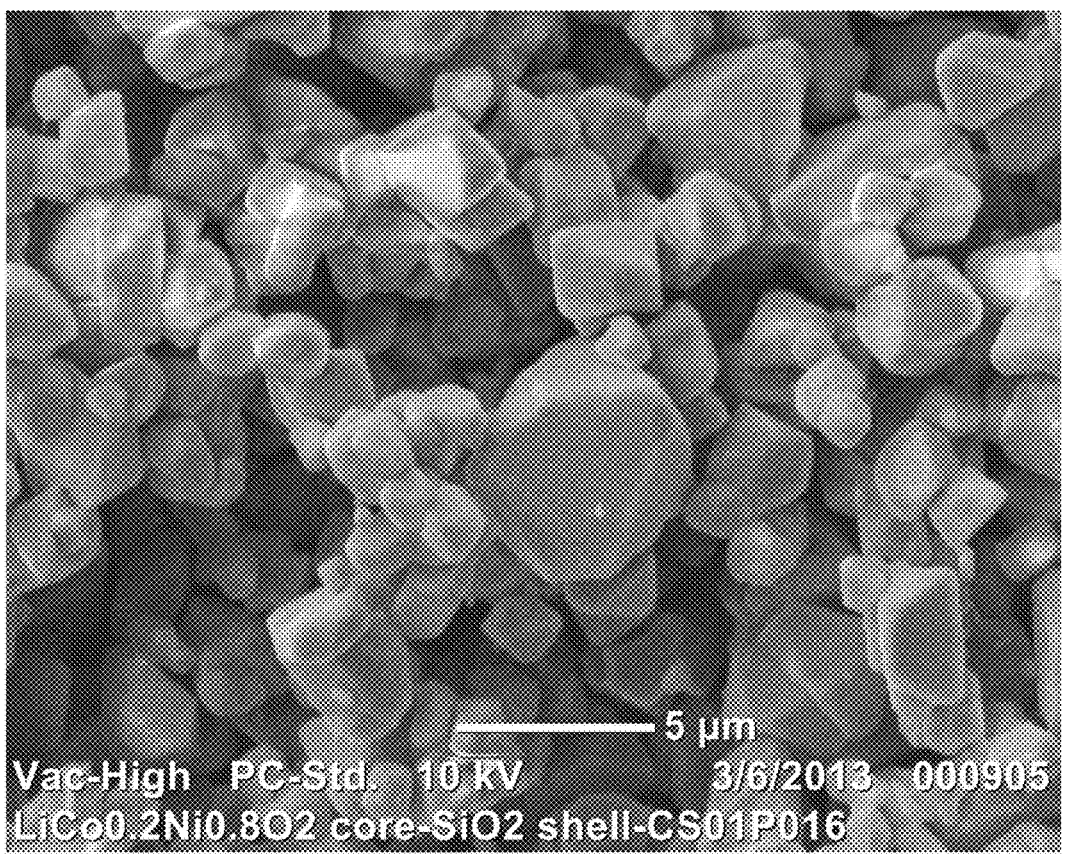

(CS01P016) Preparation of Core-Shell Structure of Lithium Nickel Cobalt Oxide $LiCo_{0.2}Ni_{0.8}O_2$ with an Estimated 20 nm Silicon Dioxide Shell To a 100 ml plastic beaker, is added 0.0496 g of 12.6% wt TMA silicate, 40 g DI-water and 1.48 g of 1.5 mmol/g lithium hydroxide. The solution total weight is brought up to 50 g by adding additional DI-water. To the thus-prepared solution, is added 0.5 g $LiCo_{0.2}Ni_{0.8}O_2$ with average crystal particle size ~3 um. The mixture is shaken vigorously overnight, and then the ceramic powder is isolated by centrifuge. The collected ceramic powder is placed in oven and heated at 500° C. for 5 hours, giving the core-shell structure ceramic powder in accordance with the present invention. FIG. 11 is an SEM micrograph of the ceramic powder thus produced.

Example 6

Figure 12:
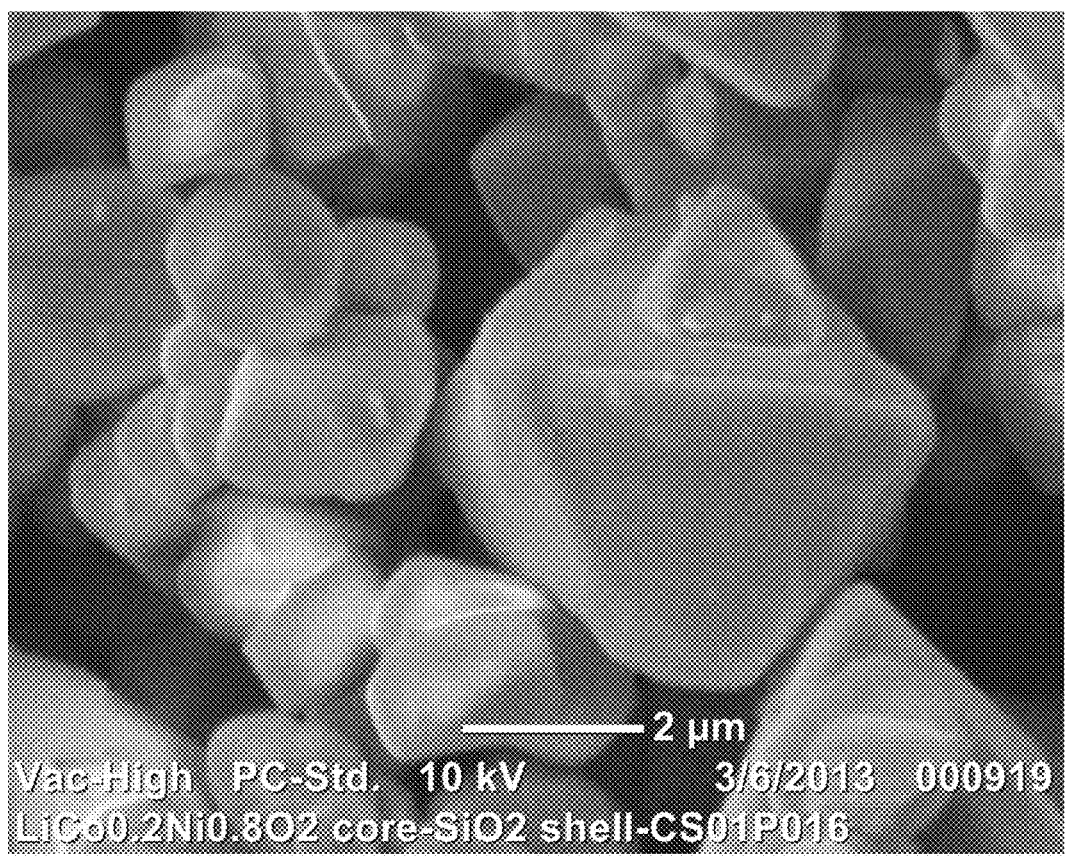
Figure 13:
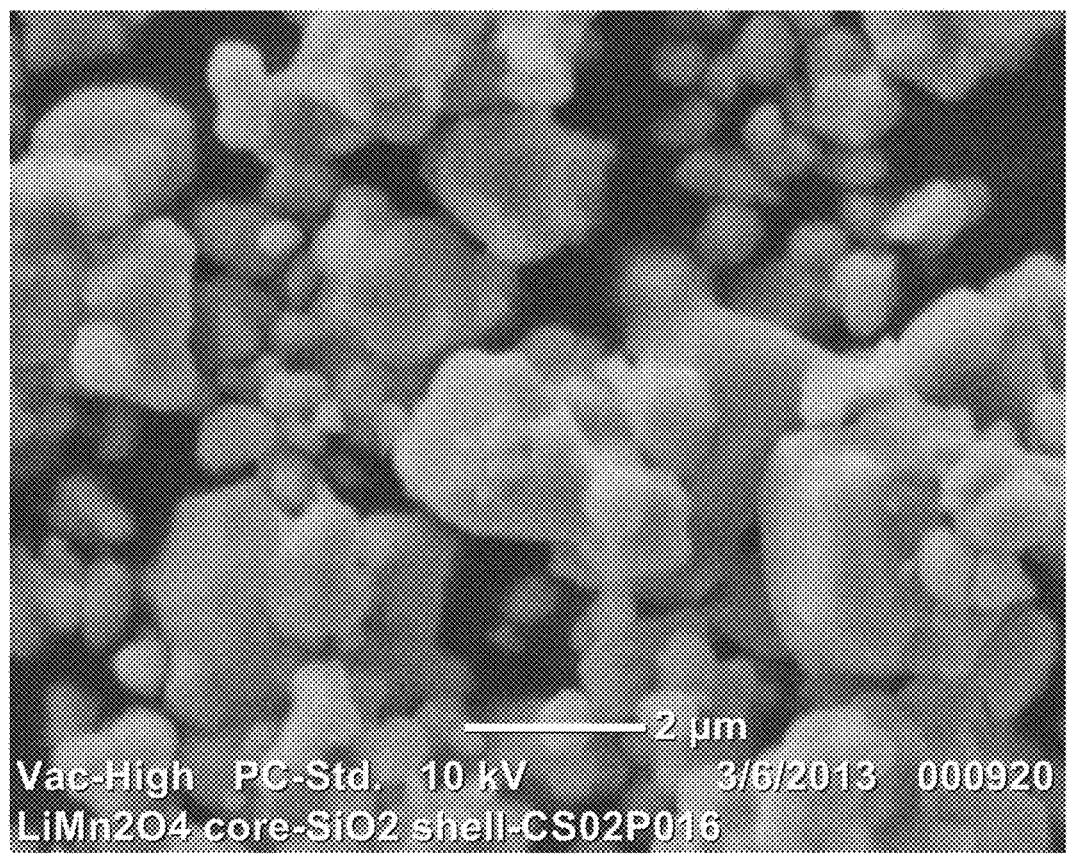
Figure 14:
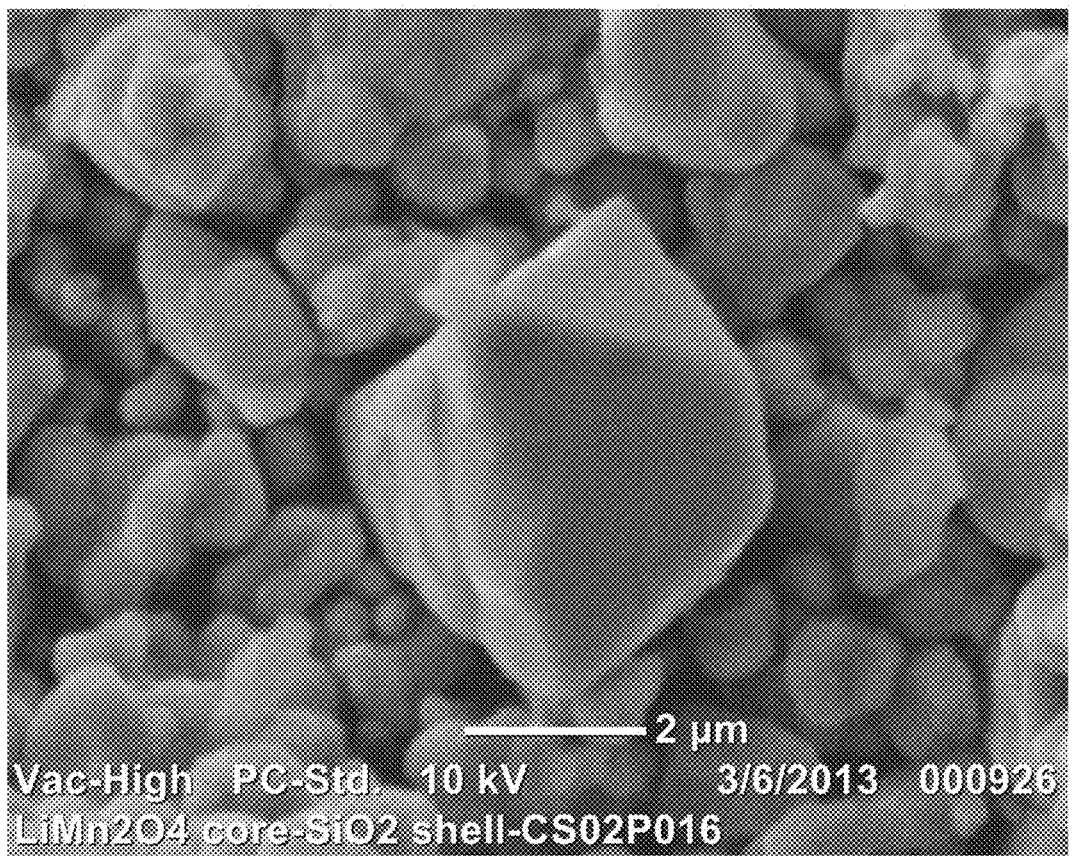

(CS02P016) Preparation of Core-Shell Structure of Lithium Manganese Oxide $LiMn_2O_4$ with a Silicon Dioxide Shell To a 100 ml plastic beaker, is added 0.0496 g of 12.6% wt TMA silicate, 40 g DI-water and 1.48 g of 1.5 mmol/g lithium hydroxide. The solution total weight is brought up to 50 g by adding additional DI-water. To the thus-prepared solution, is added 0.5 g $LiMn_2O_4$ with average crystal particle size ~1~2 μm. The mixture is shaken vigorously overnight, and then the ceramic powder is isolated by centrifuge. The collected ceramic powder is placed in oven and heated at 500° C. for 5 hours, giving the core-shell structure ceramic powder in accordance with the present invention. FIG. 12 shows the XRD pattern of pure $LiMn_2O_4$ ceramic powder, its SEM micrograph is shown in FIG. 13. The as-prepared core-shell structure ceramic powder in this example has a SEM micrograph shown in FIG. 14.

Example 7

Figure 15:
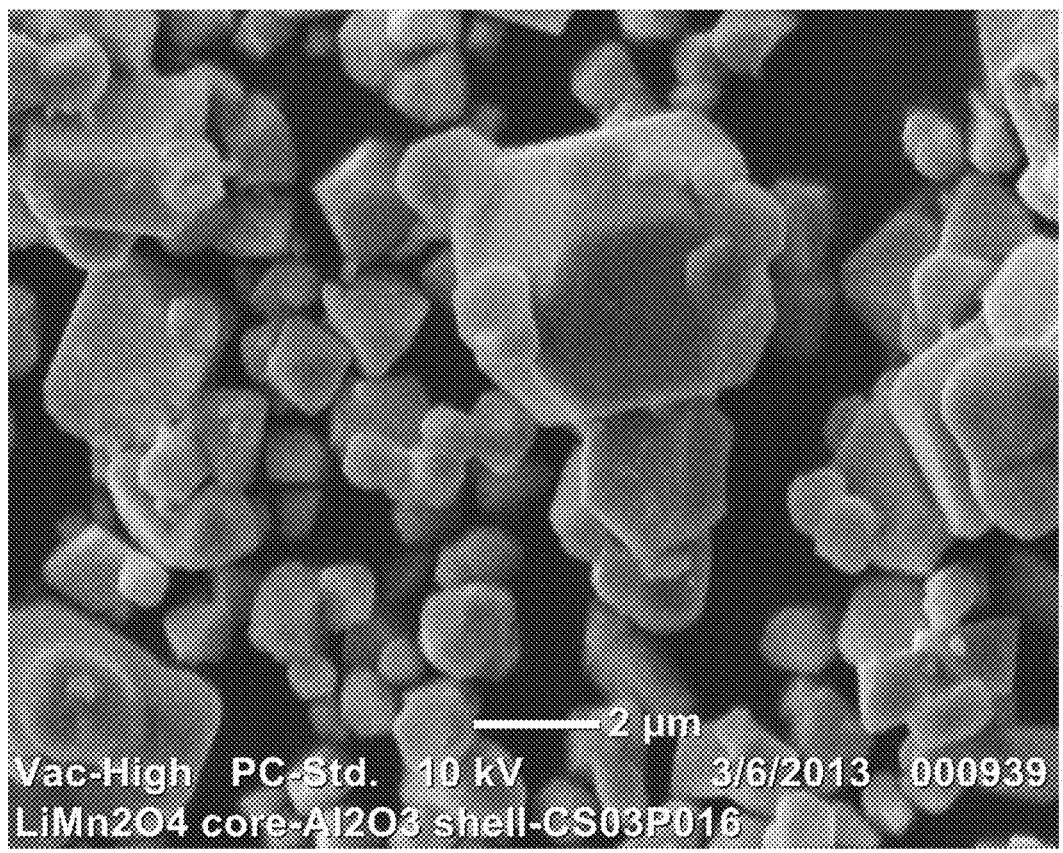

(CS01P016) Preparation of Core-Shell Structure of Lithium Manganese Oxide $LiMn_2O_4$ with an Aluminum Oxide Shell To a 100 ml plastic beaker, is added 1.188 g of 0.311 mmol/g TMA aluminate, 40 g DI-water and 1.48 g of 1.5 mmol/g lithium hydroxide. The solution total weight is brought up to 50 g by adding additional DI-water. To the thus-prepared solution, is added 0.5 g $LiMn_2O_4$ with average crystal particle size ~1~2 m. The mixture is shaken vigorously overnight, and then the ceramic powder is isolated by centrifuge. The collected ceramic powder is placed in oven and heated at 500° C. for 5 hours, giving the core-shell structure ceramic powder in accordance with the present invention. FIG. 15 is an SEM micrograph of the ceramic powder thus produced.

It is noted that, throughout the specification and claims, the numerical limits of the disclosed ranges and ratios may be combined, and are deemed to include all intervening values. Furthermore, all numerical values are deemed to be preceded by the modifier "about", whether or not this term is specifically stated.

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the appended claims.

The invention claimed is:

1. A process for depositing an oxide coating on an inorganic substrate, comprising:
providing an aqueous solution containing a tetraalkylammonium polyoxoanion and lithium ions wherein the tetraalkylammonium polyoxoanion contains a stoichiometric molar ratio of tetraalkylammonium to polyoxoanion of 3:1;
contacting the aqueous solution with an inorganic substrate for a time sufficient to deposit by heterogeneous nucleation a chemically bonded lithium polyoxoanion on surfaces of the inorganic substrate to form an initially coated inorganic substrate; and
heating the initially coated inorganic substrate for a time sufficient to convert the lithium polyoxoanion to an oxide to form on the inorganic substrate an oxide coating derived from the polyoxoanion.

2. The process of claim 1 wherein the tetraalkylammonium polyoxoanion comprises tetramethylammonium polyoxoanion.

3. The process of claim 1 wherein the tetraalkylammonium polyoxoanion comprises a polyoxoanion having the general formula $A_xO_y^{z-}$, wherein A represents a transition metal or a metal or metalloid selected from Al, Si, B, Ga, Ge, As, In, Sn, Sb, Tl, Pb and Bi, or a combination of any two or more thereof, O is an oxygen atom, and values of x, y and z depend on the valence of A in the polyoxoanion and y>x.

4. The process of claim 3 wherein the transition metal comprises one or more of Ti, V, Zn, Ni, Co, Mn, Fe and Cu.

5. The process of claim 1 wherein the inorganic substrate comprises a ceramic oxide.

6. The process of claim 5 wherein the ceramic oxide comprises $Li^+$ ions and is a lithium ion battery ceramic cathode material.

7. The process of claim 1 wherein the inorganic substrate comprises a semiconductor material.

8. The process of claim 7 wherein the semiconductor material comprises a semiconductor wafer, wherein optionally the semiconductor wafer comprises electronic circuitry.

9. The process of claim 1 wherein the tetraalkylammonium polyoxoanion is tetramethylammonium aluminate and the inorganic substrate is a ceramic material.

10. The process of claim 9 wherein the ceramic material is a lithium ion battery cathode material.

11. A process for depositing an alumina coating on an inorganic substrate, comprising:
providing an aqueous solution containing a tetraalkylammonium aluminate and lithium ions wherein the tetraalkylammonium aluminate contains a stoichiometric molar ratio of tetraalkylammonium to aluminate of 3:1;
contacting the aqueous solution with an inorganic substrate for a time sufficient to deposit by heterogeneous nucleation a chemically bonded lithium aluminate on surfaces of the inorganic substrate to form an initially coated inorganic substrate; and
heating the initially coated inorganic substrate for a time sufficient to convert the lithium aluminate to an oxide to form on the inorganic substrate an oxide coating derived from the lithium aluminate.

12. The process of claim 11 wherein the inorganic substrate is a ceramic material.

13. The process of claim 12 wherein the ceramic material is a lithium ion battery cathode material.

14. The process of claim 11 wherein the tetraalkylammonium aluminate is tetramethylammonium aluminate.

15. The process of claim 1 wherein the heating is carried out at a temperature in the range from about 450° C. to about 1000° C., or at a temperature of about 500° C.

16. The process according to claim 11 wherein the heating is carried out at a temperature in the range from about 450° C. to about 1000° C., or at a temperature of about 500° C.

* * * * *